(12) United States Patent
Kitsuki et al.

(10) Patent No.: US 7,442,929 B2
(45) Date of Patent: Oct. 28, 2008

(54) SCANNING ELECTRON MICROSCOPE

(75) Inventors: Hirohiko Kitsuki, Hitachinaka (JP); Kazuo Aoki, Hitachinaka (JP); Mitsugu Sato, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 252 days.

(21) Appl. No.: 11/397,812

(22) Filed: Apr. 5, 2006

(65) Prior Publication Data
US 2006/0226362 A1 Oct. 12, 2006

(30) Foreign Application Priority Data
Apr. 6, 2005 (JP) ............................ 2005-110082

(51) Int. Cl.
*G01N 23/00* (2006.01)
(52) U.S. Cl. .................. 250/310; 250/307; 250/306; 250/311; 250/396 R; 250/396 ML
(58) Field of Classification Search ................ 250/310, 250/307, 306, 311, 396 R, 396 ML
See application file for complete search history.

(56) References Cited

U.S. PATENT DOCUMENTS

| | | | | |
|---|---|---|---|---|
| 5,003,173 | A * | 3/1991 | De Jong | 250/311 |
| 5,276,331 | A * | 1/1994 | Oae et al. | 250/396 ML |
| 6,054,710 | A * | 4/2000 | Bruggeman | 250/307 |
| 6,946,670 | B1 * | 9/2005 | Zurbrick | 250/559.06 |
| 2002/0079448 | A1 * | 6/2002 | Ishitani et al. | 250/310 |
| 2002/0125428 | A1 * | 9/2002 | Krans | 250/311 |
| 2003/0189172 | A1 * | 10/2003 | Sawahata et al. | 250/310 |
| 2004/0183016 | A1 * | 9/2004 | Sawahata et al. | 250/310 |

FOREIGN PATENT DOCUMENTS

| | | | |
|---|---|---|---|
| JP | 1-236563 A | | 9/1989 |
| JP | 01236563 A | * | 9/1989 |
| JP | 02-100252 | | 4/1990 |
| JP | 02100252 A | * | 4/1990 |
| JP | 05-258699 | | 10/1993 |

OTHER PUBLICATIONS

Sato, et al. "Evaluation of depth of field in SEM images ni terms of the information-passing capacity (IPC) and contrast gradient in SEM image" Nuclear Instruments and Methods in Physics Research A 519 (2004) 280-285.*

Walden "Analog-to-digital converter survey and analysis" IEEE Journal on Selected Areas in Communications, vol. 17 No. 4 Apr. 1999.*

Evaluation of depth of field in SEM images in terms of the information-passing capacity (IPC) and contrast gradient in SEM image, Nuclear Instruments and Methods in Physics Research A 519 (2004) 280-285.

* cited by examiner

*Primary Examiner*—Jack I. Berman
*Assistant Examiner*—Michael Maskell
(74) *Attorney, Agent, or Firm*—McDermott Will & Emery LLP

(57) ABSTRACT

A scanning electron microscope for digitally processing an image signal to secure the largest focal depth and the best resolution in accordance with the magnification for observation is disclosed. The angle of aperture of an optical system having a plurality of convergence lenses is changed by changing the convergence lenses and the hole diameter of a diaphragm. The angle α of aperture of the electron beam is changed in accordance with the visual field range corresponding to a single pixel, i.e. what is called the pixel size.

20 Claims, 6 Drawing Sheets

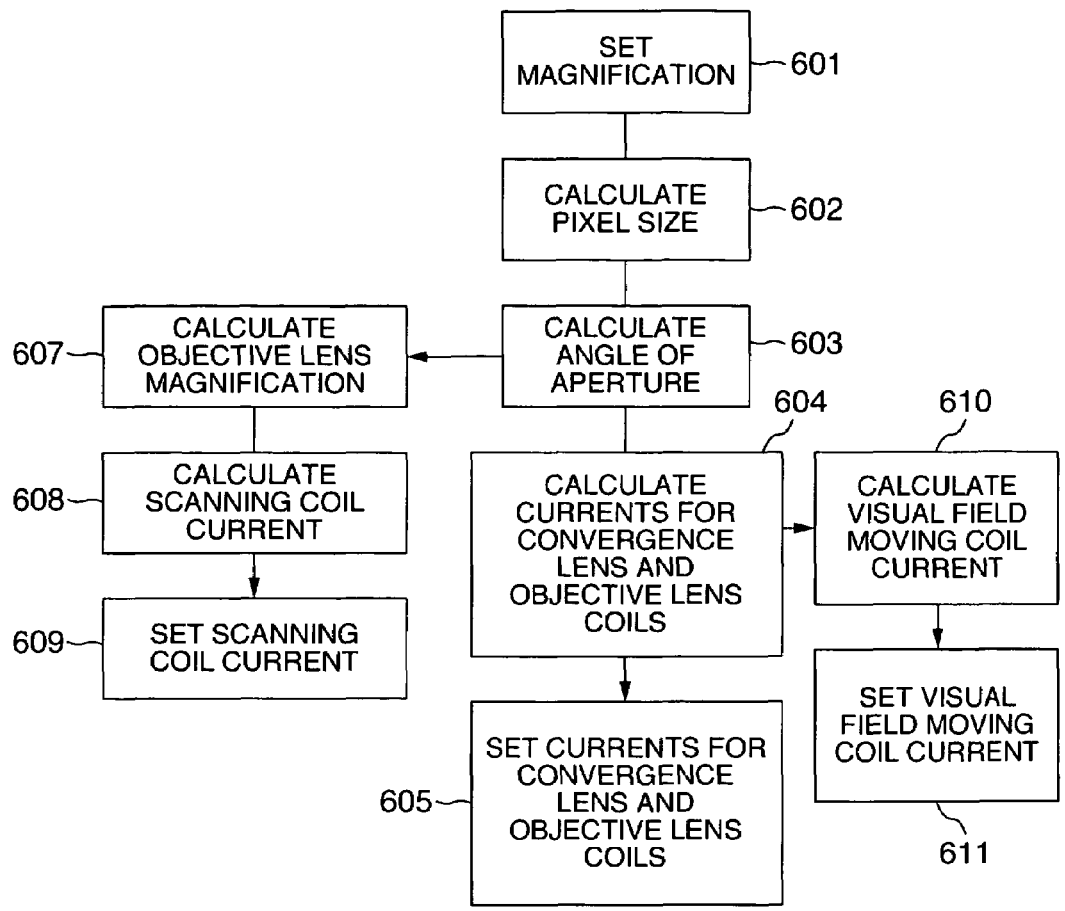
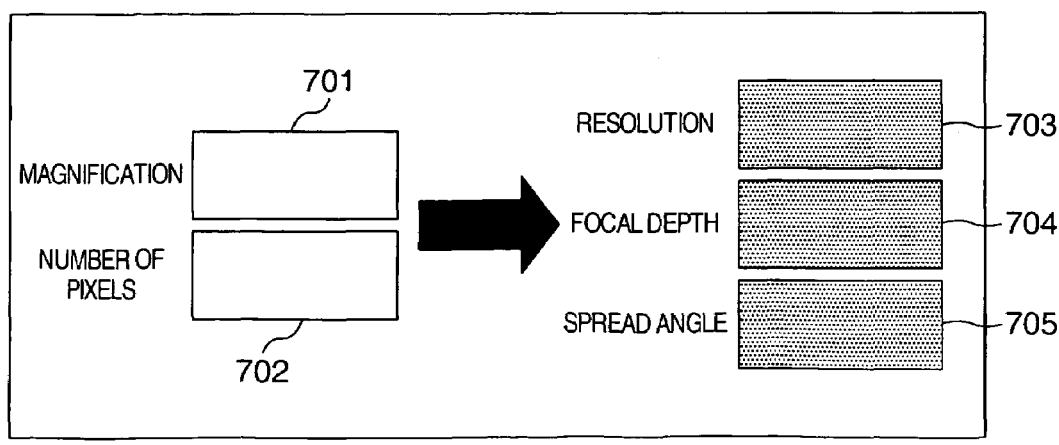

SCANNING ELECTRON MICROSCOPE

BACKGROUND OF THE INVENTION

This invention relates to a scanning electron microscope for producing a two-dimensional image by scanning a sample with a converged electron beam and digitally processing the secondary particle signal generated.

In observing a sample having a large surface roughness, a scanning electron image is blurred and a clear image cannot be obtained in the case where the focal depth of the electron beam is smaller than the roughness of the sample. In this case, a clear image can be obtained by reducing the angle of aperture of the electron beam and increasing the focal depth. A smaller angle of aperture, however, would increase the diameter of the electron beam due to the diffraction effect of a diaphragm and deteriorate the image resolution. Thus, the focal depth and the diameter of the electron beam are in the tradeoff relation to each other. On the assumption that the resolution of human eyes is limited and therefore the diameter of the electron beam should not be more than the resolution of human eyes against the scanning electron image, JP-A-1-236563 proposes an electron microscope in which the diameter of the electron beam is set to at least the minimum angle of aperture of the electron beam not more than the resolution of human eyes in accordance with the magnification change of the scanning electron image thereby to attain the maximum focal depth against the set magnification for observation.

In the scanning electron microscope recently used, the secondary particle signal is exclusively subjected to analog-to-digital conversion and projected on a display or the like. In the process, the scanning electron image is configured of pixels having a finite display area. The resolution of the scanning electron image, therefore, is not more than the visual field area corresponding to one pixel, i.e. what is called a pixel size. The resolution of the scanning electron image digitally processed in this way is described in "Nuclear Instruments and Methods in Physics Research A519 280". In this reference, the resolution of the digital scanning electron image is evaluated using the information passing capacity (IPC) method. As long as the pixel size is sufficiently small as compared with the diameter of the electron beam, the resolution is substantially equal to the diameter of the electron beam, whereas the resolution is deteriorated with the increase in pixel size. The resolution of the scanning electron image for the image magnification at which the diameter of the electron beam is sufficiently smaller than the pixel size is at most 1.7 Lp, where Lp is the pixel size.

SUMMARY OF THE INVENTION

The pixel size is determined by the visual field area and the number of pixels. The number of pixels is defined as the number of pixels per screen in digital conversion. The number of pixels is required to be changed in accordance with the purpose of observation. In the case where the number of pixels is increased to improve the image resolution, the sampling time in analog-to-digital conversion is increased, resulting in an increased image pickup time. For this reason, the number of pixels sufficient to secure the required image resolution is set in accordance with the size of the sample to be observed and the magnification for observation. In this way, the digital information for resolution is changed in accordance with the pixel size to maintain resolution of the scanning electron image.

In JP-A-1-236563, the diameter of the electron beam is calculated from the magnification for observation and the image blur amount allowable for observation. The digital processing according to this method, however, fails to take the resolution of the scanning electron image as a digital image into consideration and cannot keep up with the change in the number of pixels.

Also, in the image processing of the scanning electron image, the evaluation of the image resolution corresponding to the pixel size is required. As an example of the function of automatic regulation of the focal point, or what is called the auto focusing function of the electron beam microscope, the following operation is performed. Specifically, an scanning electron image is picked up while changing the focal point, and the acquired image is differentiated to calculate the feature amount indicating the strength of contrast. From this feature amount, the optimum focal point is determined. In order to perform this auto focusing function accurately, the angle of aperture of the electron beam is required to be set in such a manner as to attain a sufficient resolution of the scanning electron image. In the process, the resolution is required to be evaluated taking the pixel size into consideration in the case where the scanning electron image acquired by auto focusing function is digital information.

The object of this invention is to provide a method of securing the largest focal depth and the optimum resolution for the scanning electron microscope for digitally processing the image signal.

In order to achieve this object, according to this invention, there is provided a scanning electron microscope comprising a means for changing the angle of aperture of the optical system including a plurality of convergence lenses and a means for storing the conditions of the convergence lenses and the coil for correcting the visual field, wherein the optical conditions are switched appropriately by setting the angle of aperture of the electron beam in accordance with the pixel size of the scanning electron image using the means described above.

Specifically, according to this invention, there is provided a scanning electron microscope comprising a sample holder for holding a sample, an electron beam source, a plurality of convergence lenses for converging the electron beam emitted from the electron beam source, an objective lens for radiating the converged electron beam as a micro spot on the sample, a scanning coil for scanning the electron beam on the sample, a detector for detecting the sample signal generated from the sample irradiated with the electron beam, an analog-to-digital (A/D) converter for converting the analog detection signal of the detector to a digital signal, a storage unit for storing the digital signal converted by the A/D converter as an image signal, and a display unit for displaying an image associated with the image signal stored in the storage unit, wherein the A/D converter is adapted to switch the number of pixels per screen by changing the sampling rate, and the angle of aperture of the electron beam is changed in accordance with the pixel size (visual field area per pixel) determined in accordance with the number of pixels per screen.

In the scanning electron microscope for digitally processing the image signal according to this invention, the largest focal depth and the optimum resolution can be secured in accordance with the change in pixel size.

Other objects, features and advantages of the invention will become apparent from the following description of the embodiments of the invention taken in conjunction with the accompanying drawings.

BRIEF DESCRIPTION OF THE DRAWINGS

FIG. 6 is a flowchart of the control flow for setting the angle of aperture.

FIG. 7 is a schematic diagram showing a window for setting and displaying the observation conditions.

DESCRIPTION OF THE INVENTION

Embodiments of the invention are explained below with reference to the drawings.

Figure 1:
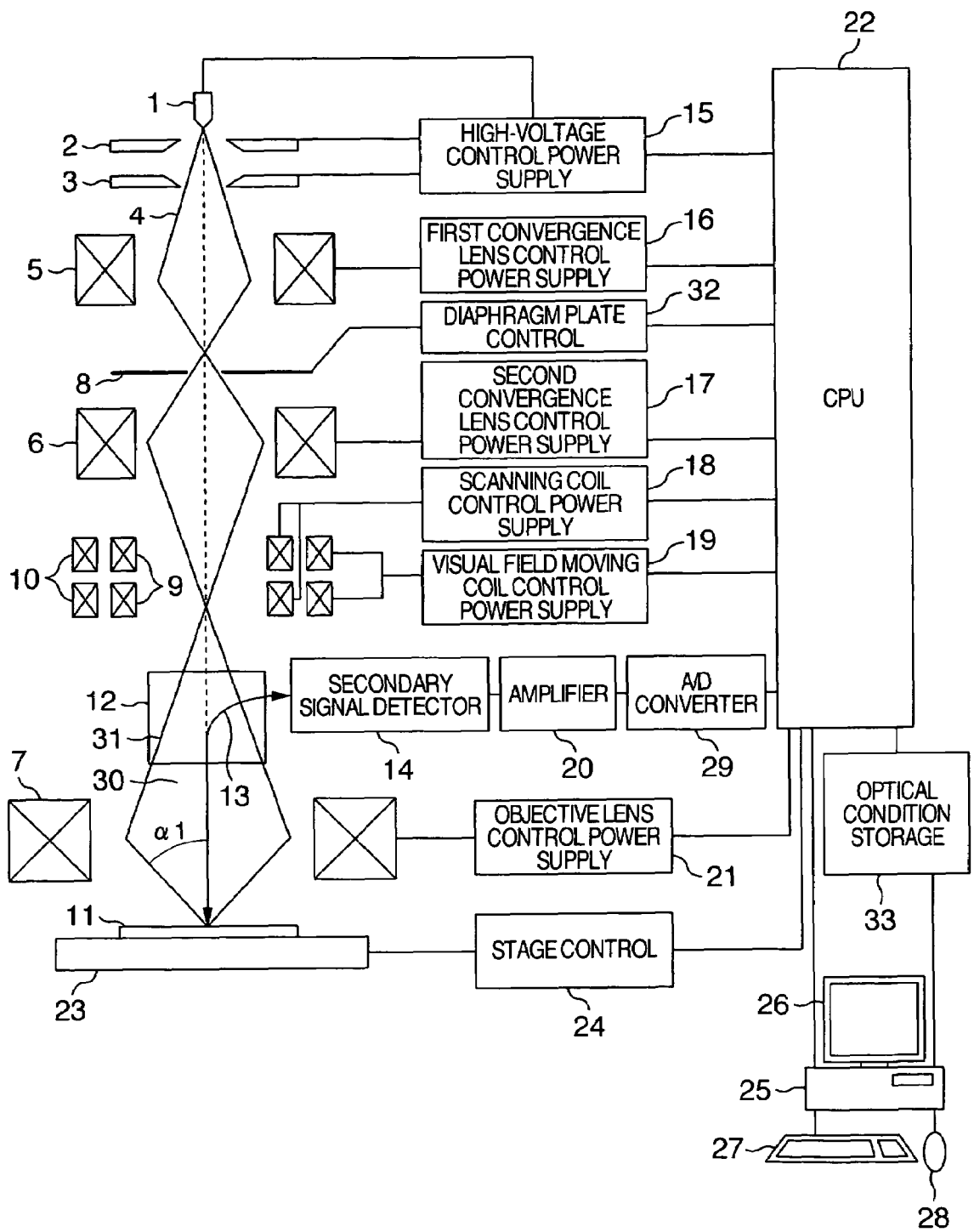
FIG. 1 is a diagram showing an example of configuration of a scanning electron microscope according to this invention.

FIG. 1 is a diagram showing an example of the configuration of a scanning electron microscope according to this invention. A voltage is applied between a negative electrode 1 and a first positive electrode 2 from a high voltage control power supply 15 controlled by a microprocessor (CPU) 22, so that a primary electron beam 4 is produced from the negative electrode 1 with a predetermined emission current. An acceleration voltage is applied between the negative electrode 1 and a second positive electrode 3 from the high voltage control power supply 15 controlled by the CPU 22, and therefore the primary electron beam 4 emitted from the negative electrode 1 is accelerated and proceeds to a lens system in subsequent stages.

The primary electron beam 4 is converged by a first convergence lens 5 controlled by a first convergence lens control power supply 16, and the unrequired area is removed by a diaphragm plate 8, after which the primary electron beam 4 is converged as a micro spot on the sample 11 held on a sample stage 23 through a second convergence lens 6 controlled by a second convergence lens control power supply 17 and an objective lens 7 controlled by an objective lens control power supply 21. The sample stage 23 is controlled by a stage control unit 24. The objective lens 7 can assume any of various forms including in-lens type, out-lens type and snorkel type (semi-in-lens type).

The primary electron beam 4 is two-dimensionally scanned on the sample by a scanning coil 9. The secondary signal (sample signal) including the secondary electrons 13 generated from the sample 11 by the radiation of the primary electron beam 4 proceeds upward of the objective lens 7, and then is separated by the difference in energy by an orthogonal electromagnetic field generating unit 12 for secondary signal separation, followed by proceeding toward the secondary signal detector 14. These secondary signals are subsequently detected by the secondary signal detector 14.

The signals from the secondary signal detector 14 are stored in a memory of a computer 25 as a two-dimensional image signal through a signal amplifier 20, an A/D converter 29 and a CPU 22. The A/D converter 29 can change the number of pixels per screen by switching the sampling rate in accordance with the image pickup time and the image resolution required. The image information stored in the computer 25 is displayed whenever necessary on an image display unit 26. The signal of a scanning coil 9 is controlled by a scanning coil control power supply 18 in accordance with the magnification for observation.

In this case, the angle of aperture $\alpha_1$ is determined by the convergence conditions of the first convergence lens 5 and the second convergence lens 6 and the hole diameter of the diaphragm plate 8.

Figure 2:
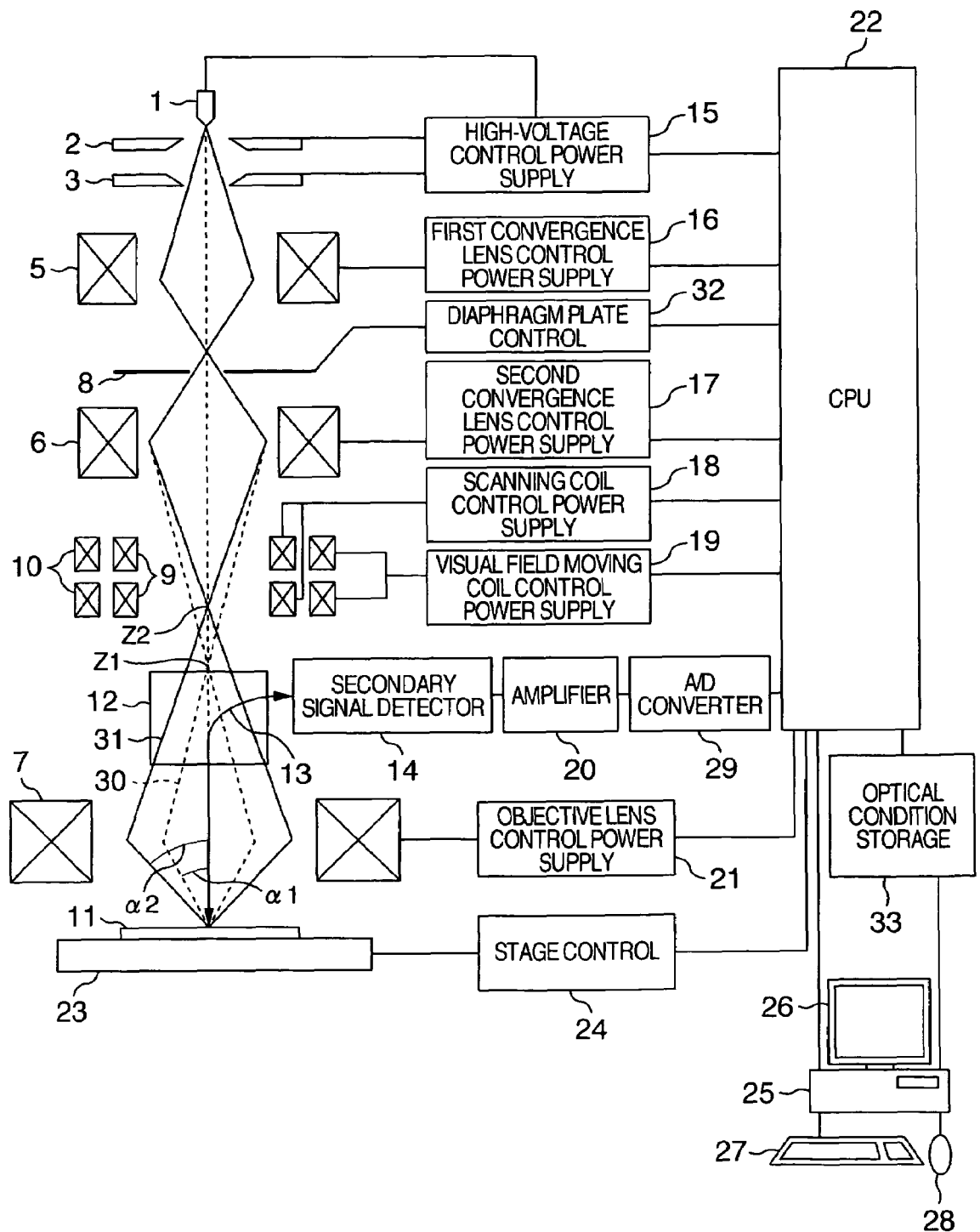
FIG. 2 is a diagram showing an example of configuration of a means for controlling the angle of aperture of the primary electron beam.

Next, FIG. 2 shows an example of configuration of a means for controlling the angle of aperture of the primary electron beam 4 in the electron microscope according to this invention.

The convergence point of the primary electron beam 4 due to the second convergence lens 6 controlled by the CPU 22 and the second convergence lens control power supply 17, i.e. what is called the second convergence lens image point can be set at an arbitrary point on the light path of the primary electron beam 4. For example, the second convergence lens image point of the primary electron beam 4 can be set at one of different points such as $Z_1$, $Z_2$ in FIG. 2. In the process, the primary electron beam 4 set at a second convergence lens image point by the second convergence lens 6 can be converged on the sample by the objective lens 7 controlled by the CPU 22 and the objective lens control power supply 21. In the case where the second convergence lens image point is $Z_1$ or $Z_2$, for example, a primary electron beam track 30 or a primary electron beam track 31 is followed downstream of the second convergence lens image point of the primary electron beam 4. By changing the second convergence lens image points and converging the primary electron beam 4 on the sample by the objective lens 7 in this way, the spread angle of the primary electron beam reaching the sample 11 can be set.

Also, a second convergence lens control parameter required to set different second convergence lens image points and an objective lens control parameter for converging the primary electron beam 4 on the sample 11 are stored in advance in an optical condition storage unit 33. These parameters are retrieved from the optical condition storage unit 33 to control the CPU 22, the second convergence lens control power supply 17 and the objective lens control power supply 21. In this way, the angle of aperture of the primary electron beam can be quickly changed. In this case, the function of the optical condition storage unit 33 can be implemented also by the CPU 22 or the computer 25.

With the movement of the second convergence lens image points, the sample point reached by the primary electron beam 4 may move due to the incoincidence between the magnetic field distribution center of the second convergence lens 6 and the objective lens 7 and the light path of the primary electron beam 4. In order to correct the amount of this movement, the primary electron beam 4 is deflected by the visual field moving coil 10 controlled by the CPU 22 and the visual field moving coil control power supply 19, so that the position can be corrected. The control parameters of the CPU 22 and the visual field moving coil control power supply 19 can be stored in advance in the CPU 22 or the computer 25.

In this case, two stages of the convergence lens are assumed and the angle of aperture is changed by controlling only the second convergence lens. A similar effect can be obtained using three or more stages of the convergence lens or by controlling two or more convergence lenses at the same time. Also, other configurations with a different position and number of the diaphragm plates 8 can be employed with equal effect.

Instead of changing the angle of aperture of the electron beam using the convergence lenses as in the aforementioned case, a similar effect can be produced by changing the angle of aperture by switching a plurality of diaphragm holes of different diameters.

Figure 3:
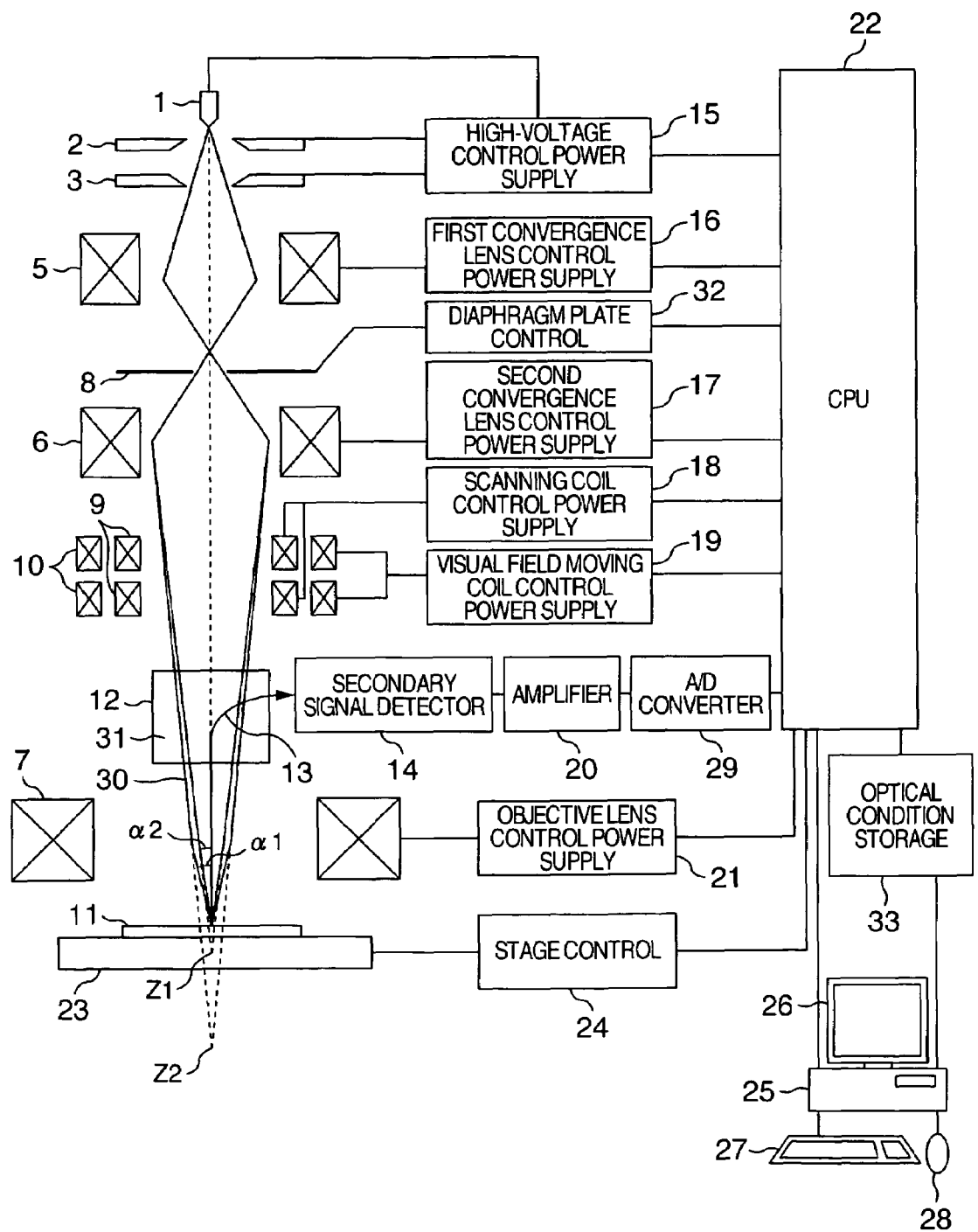
FIG. 3 is a schematic diagram showing the electron beam track in Low Mag mode.

According to this embodiment, the angle of aperture of the objective lens is changed by changing the second convergence lens object point. The electromagnetic lens, however, may have a slow response rate due to the inductance of the coil. To solve this problem, the angle of aperture can be changed more quickly by setting the conditions for electron beam convergence without any crossover point between the second convergence lens 6 and the objective lens 7. These convergence conditions are called the Low Mag mode. FIG. 3 shows the concept of an electron beam track in Low Mag mode. In Low Mag mode, the object point of the second convergence lens 6 is so long that a slight change of the current in the second convergence lens coil can considerably change the second convergence lens object point. Even with an electromagnetic lens having a low response rate, therefore, the angle of aperture can be quickly changed.

Next, a method of setting the angle of aperture of the electron beam by pixel size is explained.

Figure 4:
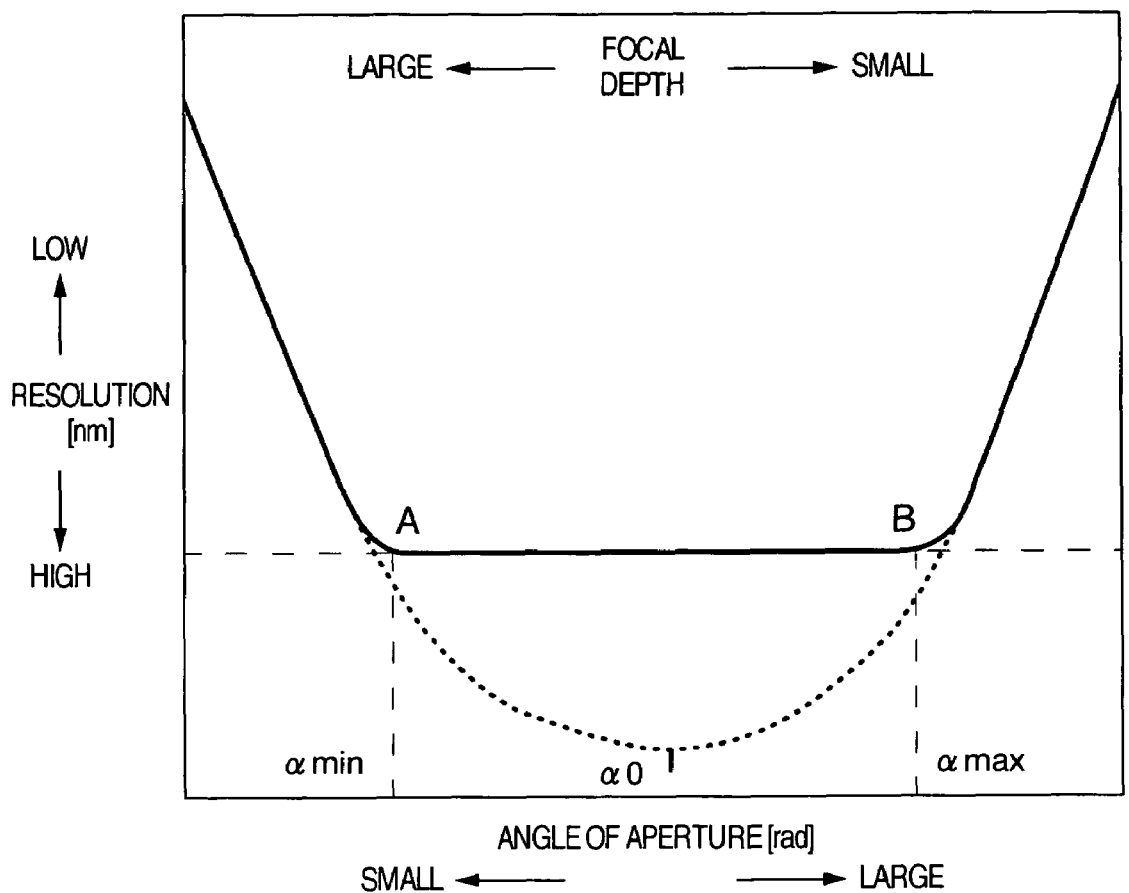
FIG. 4 is a diagram showing the relation between the angle of aperture of the electron beam and the focal depth.

The relation between the angle of aperture of the electron beam, the resolution and the focal depth is shown in FIG. 4. In the case where only the diameter of the electron beam on the sample is taken into consideration, the resolution of the scanning electron image is indicated by dotted line in FIG. 4. In this case, the minimum resolution is obtained at the angle of aperture $\alpha_0$. Normally, in order to secure the optimum resolution of the scanning electron image and a large focal depth at the same time, the area in the left half of the graph where $\alpha < \alpha_0$ is used. The relation between the angle of aperture and the resolution is acquired by an electron track simulation or experiments and stored in a memory.

The resolution of the scanning electron image obtained by digital conversion of the secondary particle signal is indicated by solid line. In the area from A to B in FIG. 4, the resolution remains unchanged by any change in the angle of aperture. This is due to the fact that the resolution of the image is limited by the pixel size. As described in the reference "Nuclear Instruments and Methods in Physics Research A519 280", in the case where the diameter of the electron beam is sufficiently small as compared with the pixel size, the best resolution is 1.7 Lp for the pixel size of Lp.

For the pixel size of Lp, therefore, both a large focal depth and a high resolution can be secured at the same time by setting the angle of aperture to $\alpha_{min}$ as indicated at point A. To set the angle of aperture to $\alpha_{min}$, the convergence lenses are controlled based in the manner described in the embodiments shown in FIGS. 2 and 3.

Figure 5:
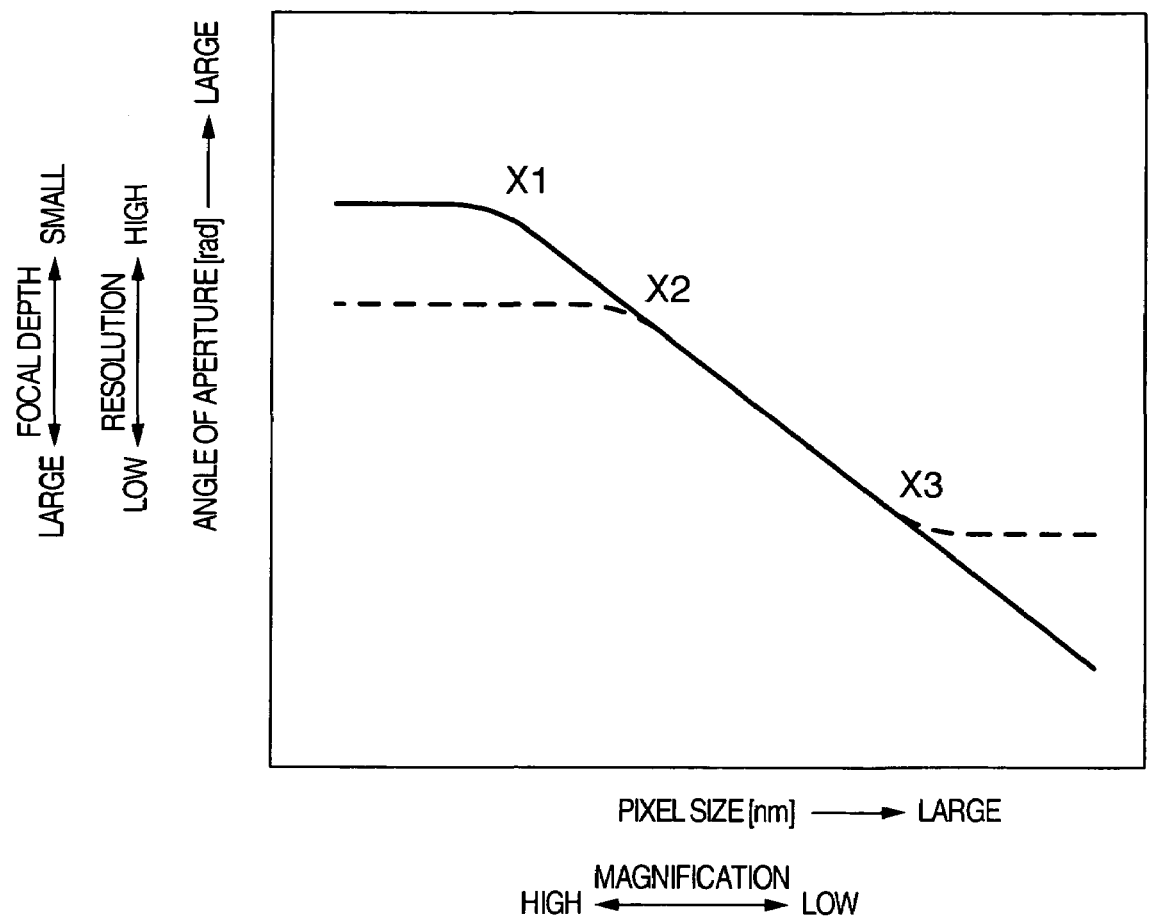
FIG. 5 is a diagram showing the relation between the pixel size and the angle of aperture.

An embodiment in which the angle of aperture is set with respect to the pixel size is explained with reference to FIG. 5. The abscissa and ordinate of FIG. 5 represent the pixel size and the angle of aperture, respectively. In the example indicated by solid line, the angle of aperture is reduced with the increase in pixel size in the area where the pixel size is larger than the point $X_1$. This is indicative of the fact that the focal depth increases with the decrease in magnification in the case where the number of pixels is fixed. In the case where the pixel size is smaller than the point $X_1$, the angle of aperture is maintained constant. In other words, in the case where the pixel size is sufficiently small as compared with the diameter of the electron beam, the resolution is not dependent on the pixel size, and therefore the angle of aperture is maintained constant to increase the focal depth.

An extremely small angle of aperture may scatter the beam due to the proximity effect caused by the Coulomb effect of electrons. This is especially conspicuously exhibited in the case where the amount of the electron beam current is large. As in the area indicated by dashed line where the pixel size is larger than the point $X_3$, therefore, the angle of aperture may be constant for not less than a predetermined number of pixels. An extremely large angle of aperture, on the other hand, the current density at the center of the electron beam track is increased and so is the flair on the outer periphery of the electron beam. The increased flair deteriorates the S/N of the scanning electron image. Even in the case where the pixel size is not sufficiently small as compared with the electron beam diameter, therefore, the angle of aperture may be controlled at a constant value as indicated by the area where the pixel size is smaller than the point $X_2$ in FIG. 5.

FIG. 6 is a flowchart for controlling the angle of aperture at the time of observation. The magnification for observation is set by the keyboard 27 or the mouse 28 shown in FIG. 2 (step 601). The magnification for observation can alternatively be set automatically by storing a series of conditions for observation in the computer 25. Next, the pixel size is calculated from the set magnification and the number of pixels (step 602). Based on the data on the relation between the angle of aperture and the resolution stored in the computer, the optimum angle of aperture for the set pixel size is calculated (step 603).

With regard to this angle of aperture, the convergence lens current and the objective lens current are calculated (step 604), followed by calculating the coil current for moving the visual field (step 610). The current for the coils of the convergence lenses, the objective lens and the coil for visual field movement are determined either from the relation between the angle of aperture stored in the memory and the current for the coils of the convergence lenses, the objective lens and alignment or by interpolation based on the data for a plurality of conditions. Based on these calculations, the convergence lens power supply and the objective lens current are set (step 605), and so is the visual field moving coil current (step 611).

After calculating the magnification of the objective lens 7 (step 607), the scanning coil current is determined to secure the set magnification (step 608). Based on the scanning coil current value thus obtained, the scanning coil current is set (step 609).

The currents for the coils of the convergence lenses and the objective lens, the alignment coil and the scanning coil may be calculated from the formula representing the relation with the angle of aperture obtained by the simulation of an electron track or experiments or by interpolation based on the data on the conditions for several angles of aperture.

As described above, according to the method of controlling the angle of aperture by pixel size, the magnification and the number of pixels per screen can be individually designated while at the same time displaying the image resolution and the focal depth on the display unit. FIG. 7 is a diagram showing an example of display on the display unit. This window is displayed on the image display unit 26 to input and display numerical values. The desired values of magnification and the number of pixels are input in the magnification input column 701 and the pixel number input column 702, respectively. These input operations are carried out by use of the keyboard 27 or the mouse 28. Upon complete input of numerical values in the magnification input column 701 and the pixel number input column 702, the angle of aperture, resolution and the focal depth are calculated by the computer 25 or the CPU 22. Based on this angle of aperture, the electron beam is controlled. Also, the focal depth and the resolution are displayed in the resolution display column 703, the focal depth display column 704 and the aperture angle display column 705 in FIG. 7.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A scanning electron microscope comprising:
a sample holder for holding a sample;
an electron beam source;
a plurality of convergence leases for converging the electron beam emitted from the electron beam source;
an objective lens for radiating the converged electron beam as a micro spot on the sample;
a scanning coil for scanning the electron beam on the sample;
a detector for detecting the sample signal generated from the sample irradiated with the electron beam;
an analog-to-digital (A/D) converter for converting the analog detection signal of the detector to a digital signal;
a storage unit for storing the digital signal converted by the A/D converter as an image signal; and
a display unit for displaying an image associated with the image signal stored in the storage unit;
wherein the A/D converter can change the number of pixels per screen to change the resolution of the image by changing the sampling rate, the number of pixels being directly related to the sampling rate, and
wherein the angle of aperture of the electron beam is changed in accordance with the pixel size (visual field area per pixel) determined in accordance with the number of pixels per screen.

2. A scanning electron microscope according to claim 1, wherein the angle of aperture of the electron beam is changed by controlling the convergence lenses.

3. A scanning electron microscope according to claim 1, wherein the angle of aperture of the electron beam is set in such a manner as to realize the best resolution as determined by the pixel size of the image displayed on the display unit and the largest focal depth for the particular resolution.

4. A scanning electron microscope comprising:
a sample holder for holding a sample;
an electron beam source;
a plurality of convergence lenses for converging the electron bean emitted from the electron beam source;
an objective lens for radiating the converged electron beam as a micro spot on the sample;
a scanning coil for scanning the electron beam on the sample;
a detector for detecting the sample signal generated from the sample irradiated with the electron beam;
an analog-to-digital (A/D) converter for converting the analog detection signal of the detector to a digital signal;
a storage unit for storing the digital signal converted by the A/D converter as an image signal; and
a display unit for displaying an image associated with the image signal stored in the storage unit;
wherein the A/D converter can change the number of pixels per screen by switching the sampling rate,
wherein the angle of aperture of the electron beam is changed in accordance with the pixel size (visual field area per pixel) determined in accordance with the number of pixels per screen, and
wherein the angle of aperture of the electron beam is changed in accordance with the pixel size in a designated range, while the angle of aperture is set to a predetermined value regardless of the pixel size in other than the designated range.

5. A scanning electron microscope comprising:
a sample holder for holding a sample;
an electron beam source;
a plurality of convergence lenses for converging the electron beam emitted from the electron beam source;
an objective lens for radiating the converged electron beam as a micro spot on the sample;
a scanning coil for scanning the electron beam on the sample;
a detector for detecting the sample signal generated from the sample irradiated with the electron beam;
an analog-to-digital (A/D) converter for converting the analog detection signal of the detector to a digital signal;
a storage unit for storing the digital signal converted by the A/D converter as an image signal; and
a display unit for displaying an image associated with the image signal stored in the storage unit;
wherein the A/D converter can change the number of pixels per screen by switching the sampling rate,
wherein the angle of aperture of the electron beam is changed in accordance with the pixel size (visual field area per pixel) determined in accordance with the number of pixels per screen, and
wherein the angle of aperture of the electron beam is changed in accordance with the pixel size in a designated range, a first angle of aperture is set for the pixel size smaller than the designated pixel size and a second angle of aperture is set for the pixel size larger than the designated pixel size.

6. A scanning electron microscope for displaying an image based on signals generated from a sample when the sample is irradiated by an electron beam, comprising:
an electron beam irradiation unit for irradiating an electron beam to the sample;
a magnification setting unit for setting a magnification of the image;
means for changing an angle of aperture of the electron beam incident on the sample according to the magnification set by the magnification setting unit; and
an image display device for displaying an image based on the signals detected.

7. The electron microscope according to claim 6, wherein the means for changing the angle of aperture changes the angle of aperture so that the angle of aperture at a first magnification set by the magnification setting unit is larger than an angle of aperture at a second magnification higher than the first magnification to thereby irradiate the sample with an electron beam having the angle of aperture of the second magnification.

8. A scanning electron microscope for displaying on the screen an image of detected signals generated from a sample when the sample is irradiated with an electron beam, comprising:
a magnification setting unit for setting a magnification of the electron beam; and
means for changing the angle of aperture of the electron beam according to the magnification set by the magnification setting unit.

9. The scanning electron microscope according to claim 8, wherein the means for changing the angle of aperture changes the angle of aperture so that an angle of aperture at a second magnification higher than a first magnification is larger than an angle of aperture of the electron beam incident on the sample at the first magnification set by the magnification setting unit.

10. The scanning electron microscope according to claim 8, wherein the means for changing the angle of aperture sets an angle of aperture so that the angle of aperture at a second magnification higher than a first magnification is larger than the angle of aperture of the electron beam incident on the sample at the first magnification set by the magnification setting unit, and changes the angle of aperture so that the angle of aperture is larger when an image is to be obtained at the second magnification after an image is obtained at the first magnification.

11. The scanning electron microscope according to claim 8, further comprising a detector for displaying on the screen an image obtained by analog-to-digital conversion of signals generated from the sample, wherein the means for changing the angle of aperture changes the angle of aperture so that an angle of aperture at a second pixel size smaller than a first pixel size is larger than an angle of aperture of the electron beam incident on the sample when a magnification set by the magnification setting unit is used and the pixel size based on the pixel size of the image is the first pixel size.

12. The scanning electron microscope according to claim 8, further comprising:
    a detector for displaying on the screen an image obtained by analog-to-digital conversion of signals generated from the sample;
    a convergence lens for converging the electron beam to obtain an image point; and
    an objective lens for irradiating the sample with the electron beam having passed the convergence lens and having a predetermined angle of aperture,
    wherein the means for changing the angle of aperture changes the angle of aperture according to a pixel size based on a magnification set by the magnification setting unit and the number of pixels of the image.

13. The scanning electron microscope according to claim 12, further comprising a power supply for a lens control for controlling the angle of aperture.

14. The scanning electron microscope according to claim 13, wherein the lens control power supply controls an excitation strength of the convergence lens to change an image point on the path of the electron beam, and also controls an excitation strength of the objective lens to converge the electron beam incident on the sample to thereby set an angle of aperture.

15. The scanning electron microscope according to claim 12, wherein when a second magnification is higher than a first magnification set by the magnification setting unit, a larger value is set for the angle of aperture at a second magnification than at a first magnification and an image is obtained at the second magnification after an image is obtained at the first magnification.

16. The scanning electron microscope according to claim 15, wherein when an image is to be obtained at a second magnification, the lens control power supply controls the excitation strength of the convergence lens and the objective lens so that a smaller value is set for the angle of aperture at the second magnification than for the angle of aperture at the first magnification.

17. The scanning electron microscope according to claim 8, further comprising:
    a detector for displaying on the screen an image obtained by analog-to-digital conversion of signals generated from the sample;
    a convergence lens for converging the electron beam to obtain an image point; and
    an objective lens for irradiating the sample with the electron beam having passed the convergence lens and having a predetermined angle of aperture;
    wherein the means for changing the angle of aperture sets a fixed value for the angle of aperture according to a pixel size based on a magnification of the magnification setting unit and the number of pixels of the image.

18. The scanning electron microscope according to claim 17, further comprising a lens control power supply that controls an excitation strength of the convergence lens to change an image point on a light path of the electron beam, and also controls an excitation strength of the objective lens to converge the electron beam incident on the sample to thereby set an angle of aperture.

19. The scanning electron microscope according to claim 8, further comprising:
    a detector for displaying on the screen an image obtained by analog-to-digital conversion of signals generated from the sample;
    a convergence lens for converging the electron beam to obtain an image point; and
    an objective lens for irradiating the sample with the electron beam having passed the convergence lens and having a predetermined angle of aperture;
    wherein when a second magnification is higher than a first magnification set by the magnification setting unit, if an image is to be obtained at the first magnification, the beams for changing the angle of aperture sets a value for the angle of aperture according to a pixel size based on the magnification and the number of pixels of an image at the first magnification, or if an image is to be obtained at the second magnification, the means for changing the angle of aperture sets a fixed value for the angle of aperture.

20. The scanning electron microscope according to claim 19, further comprising a lens control power supply that controls an excitation strength of the convergence lens to change an image point on the light path of the electron beam and also controls an excitation strength of the objective lens to converge the electron beam incident on the sample to thereby set an angle of aperture.

* * * * *